(12) United States Patent
Sutardja et al.

(10) Patent No.: US 7,073,099 B1
(45) Date of Patent: Jul. 4, 2006

(54) METHOD AND APPARATUS FOR IMPROVING MEMORY OPERATION AND YIELD

(75) Inventors: Sehat Sutardja, Cupertino, CA (US); Saeed Azimi, Union City, CA (US)

(73) Assignee: Marvell International Ltd., Hamilton (BM)

( * ) Notice: Subject to any disclaimer, the term of this patent is extended or adjusted under 35 U.S.C. 154(b) by 306 days.

(21) Appl. No.: 10/184,334

(22) Filed: Jun. 26, 2002

Related U.S. Application Data

(60) Provisional application No. 60/384,371, filed on May 30, 2002.

(51) Int. Cl.
  *G11C 11/00* (2006.01)
(52) U.S. Cl. .................... 714/710; 714/718
(58) Field of Classification Search ............... 714/718, 714/719, 723, 710; 365/185.22, 185.09, 365/185.11, 201; 711/108, 128
See application file for complete search history.

(56) References Cited

U.S. PATENT DOCUMENTS

| | | | |
|---|---|---|---|
| 4,901,360 A * | 2/1990 | Shu et al. ............... | 382/303 |
| 4,903,268 A | 2/1990 | Hidaka et al. | |
| 5,056,095 A | 10/1991 | Horiguchi et al. | |
| 5,127,014 A | 6/1992 | Raynham | |
| 5,485,595 A | 1/1996 | Assar et al. ............ | 711/103 |
| 5,535,226 A | 7/1996 | Drake et al. | |
| 5,848,076 A | 12/1998 | Yoshimura | |
| 5,958,068 A * | 9/1999 | Arimilli et al. ........... | 714/8 |
| 5,958,079 A | 9/1999 | Yoshimura | |
| 5,959,914 A | 9/1999 | Gates et al. | |
| 6,000,006 A * | 12/1999 | Bruce et al. ............ | 711/103 |
| 6,058,047 A | 5/2000 | Kikuchi | |
| 6,065,141 A * | 5/2000 | Kitagawa ................ | 714/711 |
| 6,175,941 B1 | 1/2001 | Poeppelman et al. ...... | 714/757 |
| 6,237,116 B1 | 5/2001 | Fazel et al. ............ | 714/720 |
| 6,295,617 B1 | 9/2001 | Sonobe ................. | 714/718 |
| 6,385,071 B1 * | 5/2002 | Chai et al. ............... | 365/49 |
| 6,414,876 B1 * | 7/2002 | Harari et al. .......... | 365/185.22 |
| 6,438,726 B1 | 8/2002 | Walters, Jr. ............ | 714/764 |
| 6,457,154 B1 | 9/2002 | Chen et al. ............ | 714/768 |

OTHER PUBLICATIONS

"Memory Built-in Self-repair Using Redundant Words" Schober et al. International Test Conference Proceedings. Publication Date: Oct. 30-Nov. 1, 2001 pp. 995-1001 Inspec Accession No: 7211400.*

IBM TDB NN85112562 "System for Efficiently Using Spare Memory Components for Defect Corrections Employing Content-Addressable Memory" Date: Nov. 1, 1985.*

* cited by examiner

*Primary Examiner*—Guy Lamarre
*Assistant Examiner*—Cynthia Britt

(57) ABSTRACT

A memory circuit includes a memory interface and a first memory that receives a first write address that is associated with first data from said memory interface. A second memory stores addresses of defective memory locations found in said first memory, receives said first write address from said memory interface, compares said first write address to said addresses stored in said memory, and, if a matching address is found, writes said first data to said second memory.

12 Claims, 14 Drawing Sheets

METHOD AND APPARATUS FOR IMPROVING MEMORY OPERATION AND YIELD

CROSS-REFERENCE TO RELATED APPLICATIONS

This application claims the benefit of U.S. Provisional Application No. 60/384,371, filed May 30, 2002, which is hereby incorporated by reference.

FIELD OF THE INVENTION

The present invention relates to memory circuits, and more particularly to methods and apparatus for improving the yield and/or operation of embedded and external memory circuits.

BACKGROUND OF THE INVENTION

As the capacity of semiconductor memory continues to increase, attaining a sufficiently high yield becomes more difficult. To attain higher memory capacity, the area of a memory chip can be increased to accommodate a greater number of memory cells. Alternately, the density of the chip can be increased. Increasing the density involves reducing the size and increasing the quantity of memory cells on the chip, which leads to a proportional increase in defects.

To improve the yield, a number of techniques may be employed to fix or to compensate for the defects. A relatively expensive technique that is commonly used for repairing standard memory chips is a wafer test, sort and repair process. The capital equipment costs for burn-in and test facilities are relatively high, which can be amortized when the standard memory chips are produced in sufficiently large quantities. For lower production quantities, the amortized capital equipment costs often exceed the cost of scrapping the defective chips.

Embedded memory devices also face problems with attaining sufficient chip yield. Embedded memory devices combine logic and memory on a single silicon wafer and are not usually manufactured in large quantities. The wafer sort/test fixtures, burn-in fixtures, and repair facilities that are typically used with large quantity standard memory devices are not economically feasible. When a defect occurs on an embedded device, the device is typically scrapped.

Embedded devices typically have more defects per unit of memory than standard memory. This is due in part to the fact that the processing technology that is used for the logic is typically not compatible with the processing technology that is used for the memory. The majority of defects in an embedded device occur in the memory since most of the chip area is used for the memory. Typically, the prime yield is about 20% for conventional logic devices.

Referring now to FIG. 1, systems on chip (SOC) 10 typically include both logic 12 and embedded memory 14 that are fabricated on a single wafer or microchip. For example, the SOC 10 may be used for a disk drive and include read channels, a hard disk controller, an Error Correction Coding (ECC) circuit, high speed interfaces, and system memory. The logic 12 may include standard logic module(s) that are provided by the manufacturer and/or logic module(s) that are designed by the customer. The embedded memory 14 typically includes static random access memory (SRAM), dynamic random access memory (DRAM), and/or nonvolatile memory such as flash memory.

Referring now to FIG. 2, low chip yield is due in part to the small size of the memory cells in the embedded memory 14. The small memory cells are used to reduce the chip size and lower cost. Typical defects include random single bit failures that are depicted at 16. For a 64 Mb memory module, on the order of 1000 random single bit failures 16 may occur. Other defects include bit line defects that are depicted at 18 and 20. While bit and word line defects occur less frequently than the random single bit failures 16, they are easier and less costly to fix.

Referring now to FIG. 3, the embedded memory 14 typically includes a random data portion 24 and a cache data portion 26. Bits that are stored in the random data portion 24 are accessed individually. In contrast, bits that are stored in the cache data portion 26 are accessed in blocks having a minimum size such as 16 or 64 bits.

To improve reliability, an error correction coding (ECC) circuit 28 may be used. ECC coding bits 30 are used for ECC coding. For example, 2 additional bits are used for 16 bits and 8 additional bits are used for 64 bits. The ECC circuit 28 requires the data to be written to and read from the embedded memory 14 in blocks having the minimum size. Therefore, the ECC circuit 28 and error correction coding/decoding cannot be used for the random data portion 24. When accessing the random data portion 24, the ECC coding circuit 28 is disabled as is schematically illustrated at 32. ECC coding bits also increase the cost of fabricating the memory and reduce access times.

Because each of the bits in the random data portion 24 can be read individually, single bit failures in the random data portion 24 are problematic. During the wafer sort tests, if single bit failures are detected in the random data portion 24, repair of the SOC 10 must be performed, which significantly increases the cost of the SOC 10.

SUMMARY OF THE INVENTION

A system on chip according to the present invention has improved memory yield. A logic circuit is fabricated on the chip. Embedded memory is fabricated on the chip and communicates with the logic circuit. The embedded memory includes a random data portion that provides access to individual bits and a cache data portion that provides access to groups of bits. The cache data portion is divided into a plurality of memory blocks. A swap circuit swaps a physical address of the random data portion with at least one of the memory blocks of the cache data portion if the random data portion has defects.

In other features, an error correction coding circuit communicates with the embedded memory and provides error correction coding and decoding for the cache data portion.

A memory circuit according to the present invention includes a first memory that stores data in a plurality of memory locations that are associated with memory addresses. A memory interface communicates with the first memory. A second memory communicates with the memory interface and stores memory addresses of defective memory locations that are identified in the first memory.

In other features, a memory test circuit tests the first memory to identify the memory addresses having the defective memory locations and writes addresses of the defective memory addresses to the second memory. During a write operation, a first write address of first data that is to be written to the first memory is received by the second memory and is compared to the memory addresses stored in the second memory. If the first write address matches one of the memory addresses in the second memory, the data is written to the second memory in a memory location associated with the matching memory address.

In other features, during a read operation, a first read address of first data that is to be read from the first memory is received by the second memory and is compared to the memory addresses stored in the second memory. If the read address matches one of the memory addresses, data is read from the second memory at a memory location associated with the matching memory address.

In still other features, the second memory is content addressable memory (CAM). The memory circuit is implemented in a hard disk controller.

In still other features, if the write address matches one of the memory addresses in the second memory, the data is written to a new address in the first memory. The new address is stored in the second memory in a memory location associated with the matching memory address. If the read address matches one of the memory addresses, the data is read from the first memory at a new address that is stored in the second memory in a memory location associated with the matching memory address.

Another memory circuit according to the invention includes a memory interface and a first memory that receives a first write address that is associated with first data from the memory interface. A second memory stores addresses of defective memory locations found in the first memory, receives the first write address from the memory interface, compares the first write address to the addresses stored in the second memory, and, if a matching address is found, writes the first data to the second memory.

In other features, the second memory writes the first data to a memory location in the second memory that is associated with the matching memory address. The first memory writes the first write data to a memory location in the first memory corresponding to the first write address. The memory circuit is implemented in a hard drive controller.

Another memory circuit according to the present invention includes a memory interface and a first memory that receives a first read address from the memory interface. A second memory stores addresses of defective memory locations found in the first memory, receives the first read address from the memory interface, compares the first read address to the addresses stored in the second memory, and, if a matching address is found, reads first data from the second memory.

In other features, the second memory reads the first data from a memory location in the second memory that is associated with the matching memory address. The first memory reads second data from a memory location in the first memory corresponding to the first read address. A multiplexer receives the first and second data from the first memory and the second memory when the matching address is found. The multiplexer outputs the first data from the second memory to the memory interface.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
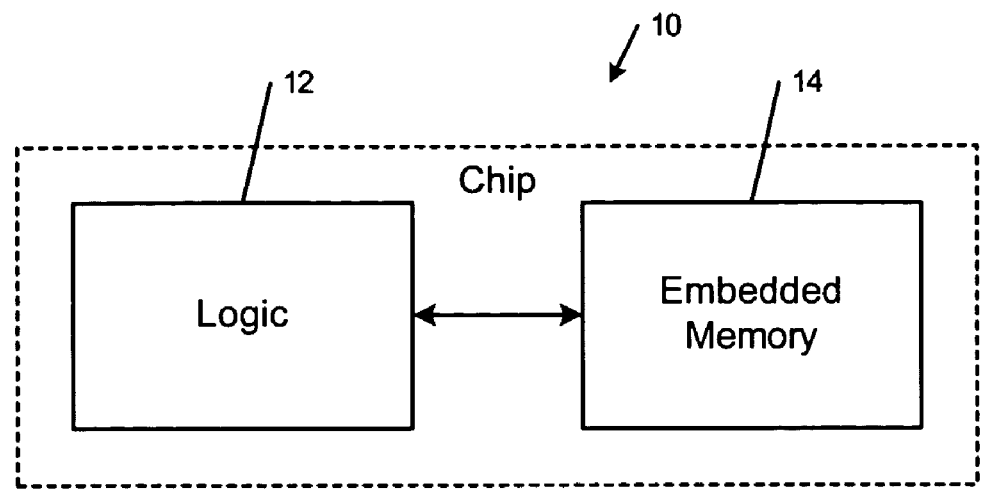
FIG. 1 is a functional block diagram of a system on chip (SOC) including logic and embedded memory that are fabricated on a microchip according to the prior art.
Figure 2:
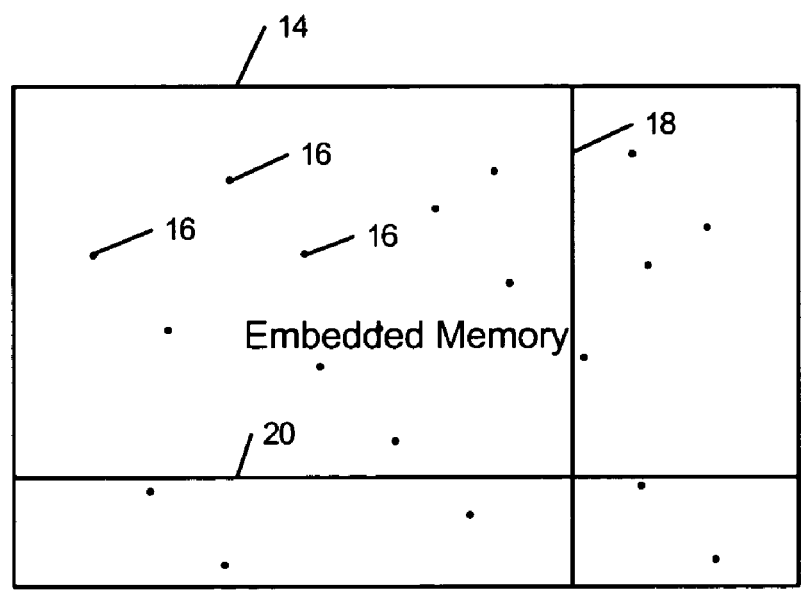
FIG. 2 illustrates defects in the embedded memory of FIG. 1.
Figure 3:
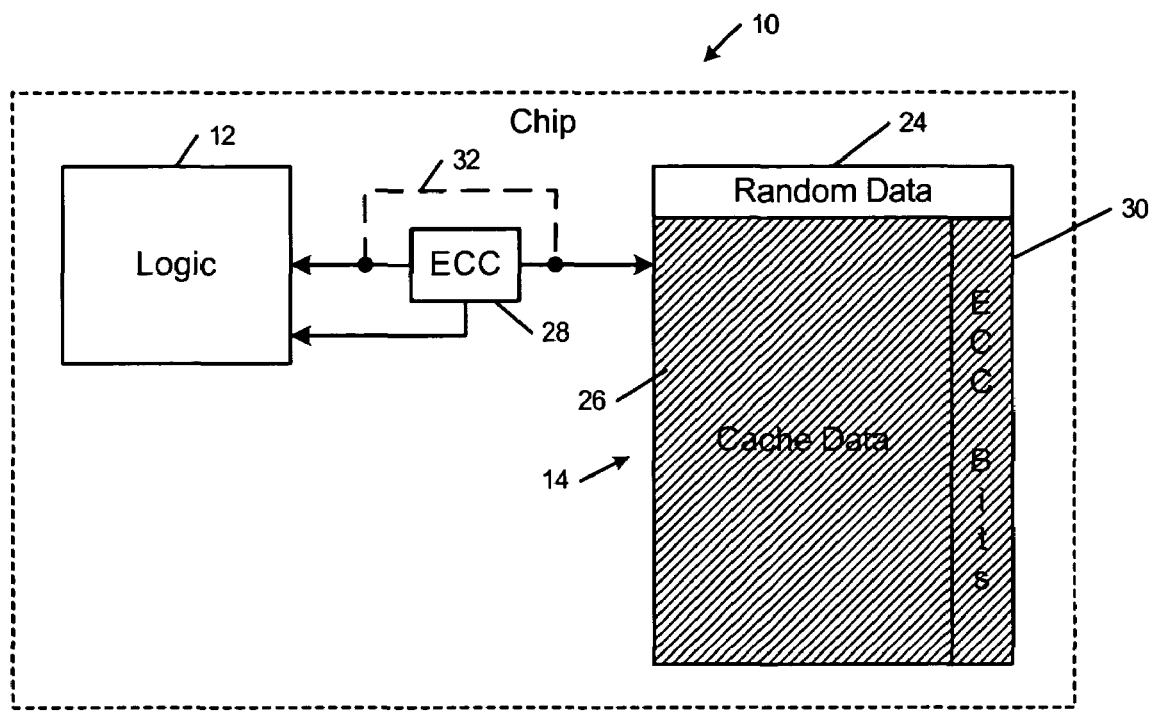
FIG. 3 is a functional block diagram of a SOC including an error correction coding circuit (ECC) according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 4A:
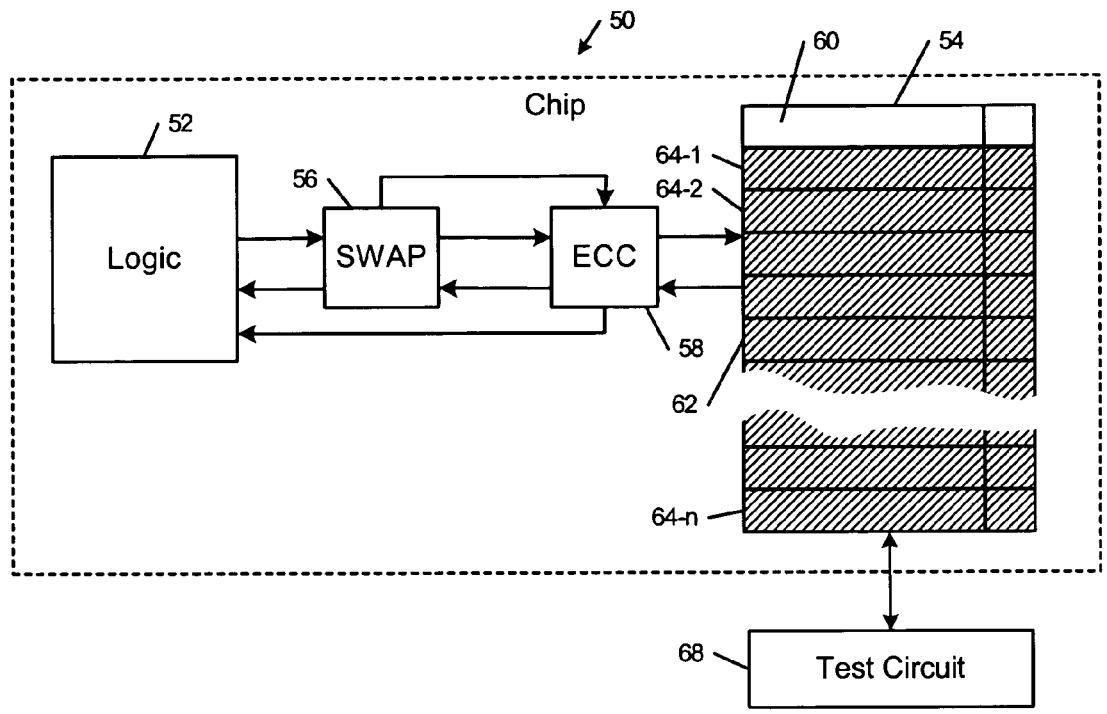
FIGS. 4A and 4B are functional block diagrams illustrating a first SOC according to the present invention.
Figure 4B:
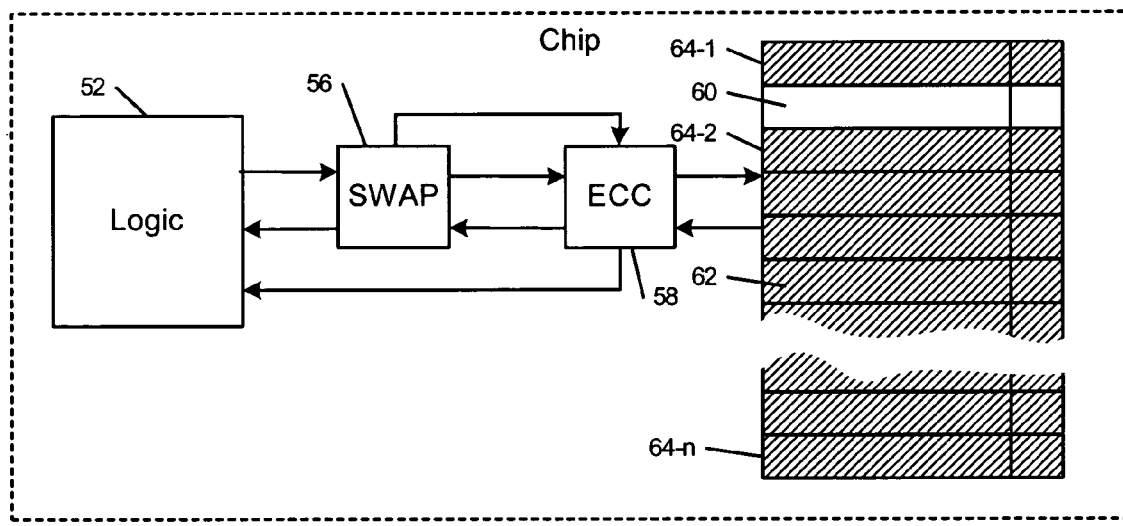

Referring now to FIGS. 4A and 4B, a system on chip (SOC) 50 according to the present invention is shown. The SOC 50 includes logic 52, embedded memory 54, a swap circuit 56 and an error correction coding (ECC) circuit 58 that are fabricated on a single wafer or microchip. The embedded memory 54 includes a random data portion 60 and a cache data portion 62. The cache data portion 62 is divided into a plurality of blocks 64-1, 64-2, . . . and 64-n. The size of the n blocks may be equal to, larger or smaller than the size of the random data portion 60. As can be appreciated, the random data portion 60 may also be divided into blocks.

Initially, the random data portion 60 of the SOC 50 may be positioned in a first or top location in the embedded memory 54. If defects are detected in the random data portion 60 during initial testing or later in use, the random data portion 60 is swapped with one of the n blocks 64 in the cache data portion 62. The defective block is preferably logically moved to the end of the cache data portion 62 so that it is used less frequently. If the random data portion 60 is larger than the blocks 64, one or more blocks 64 may be used. Preferably, the size of the blocks 64 are an integer multiple of the size of the random data portion 60.

For example in FIG. 4B, the location of the random data portion 60 has been physically swapped with the first block 64-1. If additional defects are subsequently detected in the random data portion 60, the random data portion 60 can be physically swapped with other blocks in the cache data portion 62. The block of embedded memory 54 that contains the random data portion 60 is tested to determine whether a defect exists. The location of the defect is not important. If a defect exists, another block within the embedded memory is used.

More specifically, the logic 52 generates a logical address (LA) that is output to the swap circuit 56. If a swap has not been performed previously, the swap circuit 56 uses the LA. Otherwise, the swap circuit 56 substitutes a physical address (PA) for the LA. If the address corresponds to the random data portion 60, the swap circuit 56 disables the ECC circuit 58 (the random data portion 60 does not employ ECC). If the address corresponds to the blocks 64 of the cache data portion 62, the swap circuit enables the ECC circuit 58 and error correction coding (ECC) is performed. A memory test circuit 68 can be provided to test the memory 54 during manufacturing, assembly, operation, and/or power up. Alternately, testing can be performed by logic circuit 52. As can be appreciated, testing of the other memory circuits disclosed below can be performed in a similar manner.

Figure 5:
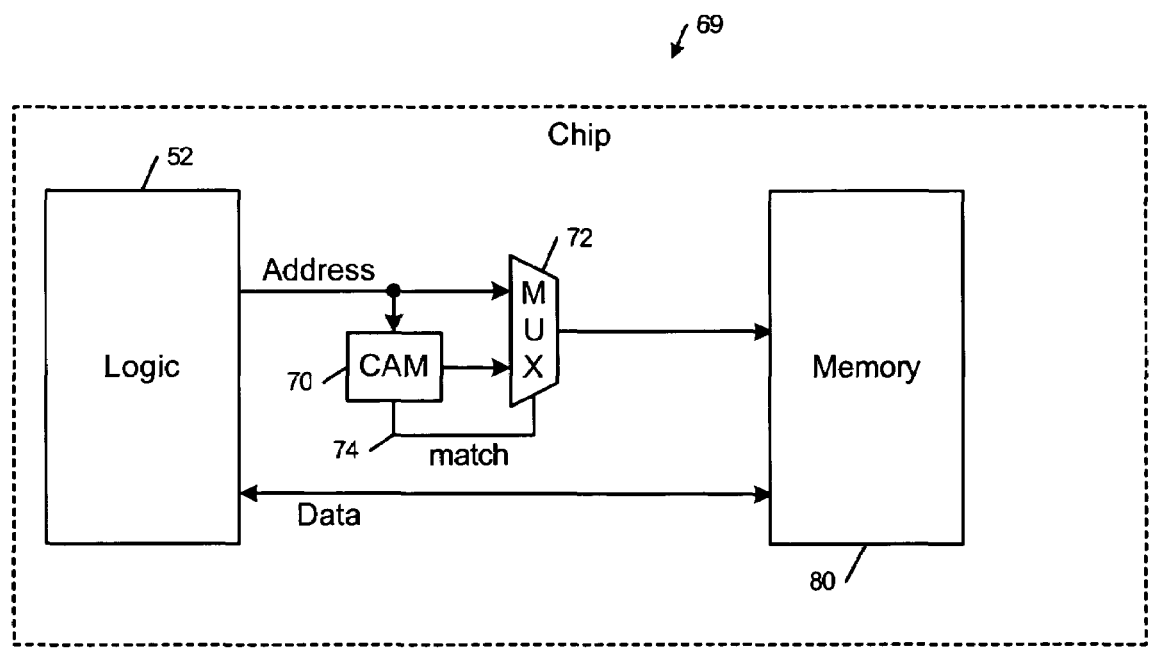
FIG. 5 is a functional block diagram illustrating a memory circuit according to the present invention.

Referring now to FIG. 5, a memory circuit 69 according to the present invention is shown. During read/write operations, address data from the logic circuit 52 and/or a memory interface is input to a CAM 70 and a multiplexer 72. If the address matches an address stored in the CAM 70, the CAM 70 signals a matched address via match line 74. The CAM outputs a substitute address corresponding to the matched address. The multiplexer 72 selects the substitute address from the CAM for output to memory 80. If there is no match, the multiplexer 72 outputs the address from logic 52. As can be appreciated, the memory 80 can be similar to memory 54 in FIGS. 4A and 4B, standard memory, memory with ECC bits or any other electronic storage.

Figure 6:
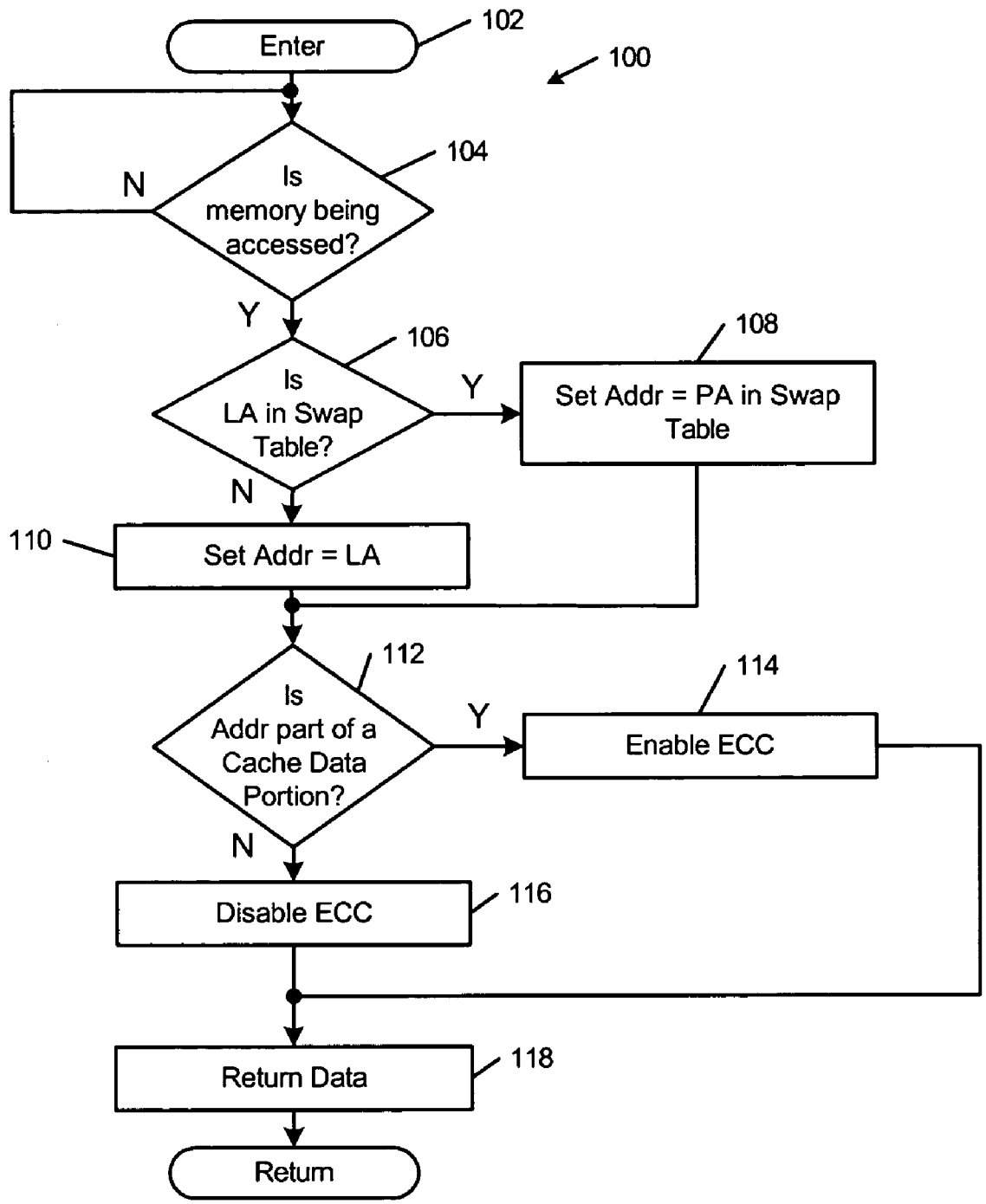
FIG. 6 is a flowchart illustrating a method for operating the memory of the SOC of FIGS. 4A and 4B according to the present invention.

Referring now to FIG. 6, steps for operating the embedded memory 54 of the SOC 50 are shown generally at 100. Control begins with step 102. In step 104, control determines whether the embedded memory 54 is being accessed by the logic 52. If not, control returns to step 104. Otherwise, control determines whether the logical address is in a swap table of the swap circuit 56 in step 106. If it is, the swap circuit 56 sets the address equal to the PA in the swap table in step 108. Otherwise, the address is set equal to the LA in step 110.

Control continues with step 112 where control determines whether the address is part of the cache data portion 62. If it is, control continues with step 114 where the ECC circuit 58 is enabled. If not, the ECC circuit 58 is disabled in step 116. Data is returned in step 118.

Figure 7:
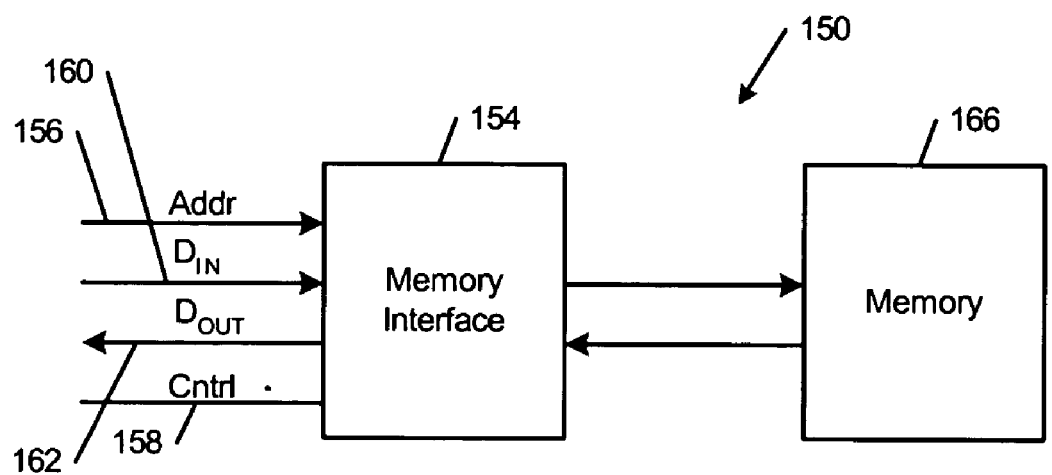
FIG. 7 is a functional block diagram of an embedded memory circuit according to the prior art.

Referring now to FIG. 7, an embedded memory circuit 150 according to the prior art is shown. The embedded memory circuit 150 includes a memory interface 154 having address and control inputs 156 and 158, respectively, data input 160, and data output 162. The memory interface 154 is connected to memory 166. The memory interface 154 and the memory 166 are formed on a single wafer along with other logic (not shown).

Figure 8:
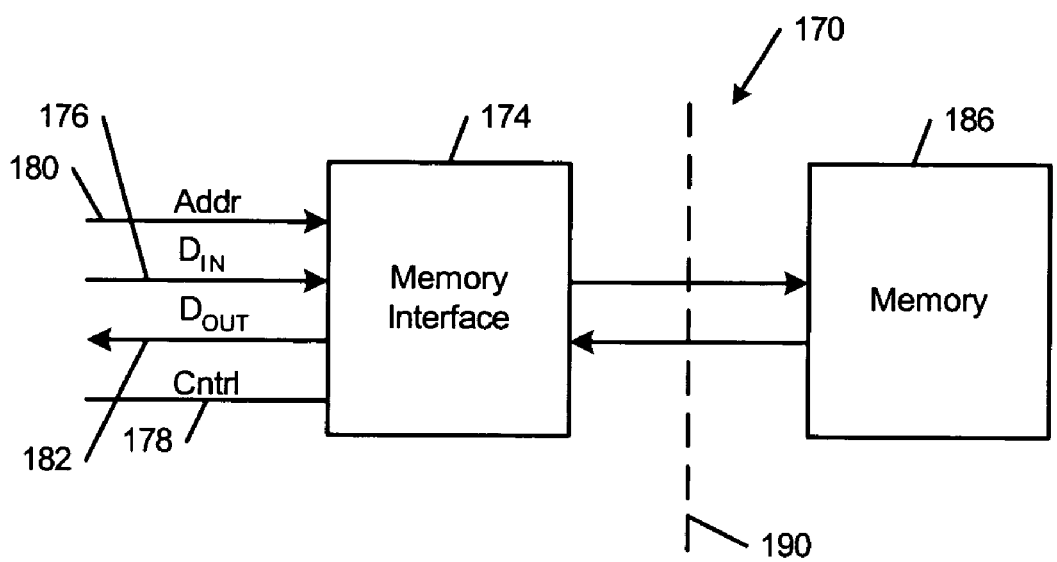
FIG. 8 is a functional block diagram of an external memory circuit according to the prior art.

Referring now to FIG. 8, an external memory circuit 170 according to the prior art is shown. The external memory circuit 170 includes a memory interface 174 having address and control inputs 176 and 178, respectively, data input 180, and data output 182. The memory interface 174 is connected to a memory 186. The memory interface 174 and the memory 186 are not formed on a single wafer as indicated by dotted lines 190. The memory interface 174 is connected to logic (not shown).

As can be appreciated, problems arise when memory locations in the memory 166 and 186 become defective. Error correction coding (ECC) can be used when data is read from and written to the memory block in blocks of data such as 16 and 64 bits. However, additional ECC bits must be added to each block of memory, which significantly increases the size of the memory. Additionally, ECC coding/decoding circuits must be added to the memory circuits 150 and 170, which increases the cost of the memory circuits. The coding/decoding algorithms also increase the read/write access times.

Figure 9:
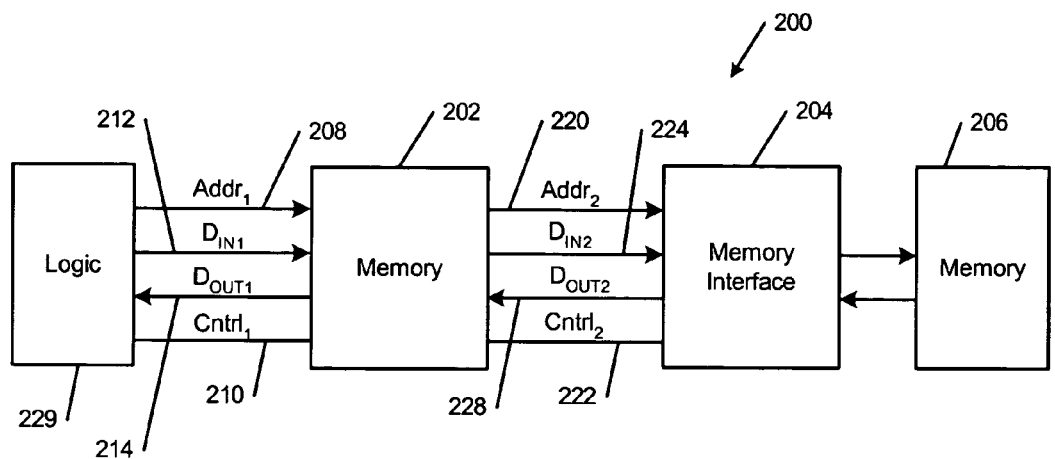
FIG. 9 is a functional block diagram of an embedded memory circuit according to the present invention.

Referring now to FIG. 9, an embedded memory circuit 200 according to the present invention is shown. The embedded memory circuit 200 includes a first memory 202, a memory interface 204, and a second memory 206. The second memory 206 includes semiconductor memory such as SDRAM, NRAM, or any other suitable memory. The first memory 202 includes first address and control inputs 206 and 208, respectively, data input 212, and data output 214. The memory interface 204 includes second address and control inputs 220 and 222, respectively, data input 224, and data output 228. The first memory 202 is coupled to logic 229.

Figure 10:
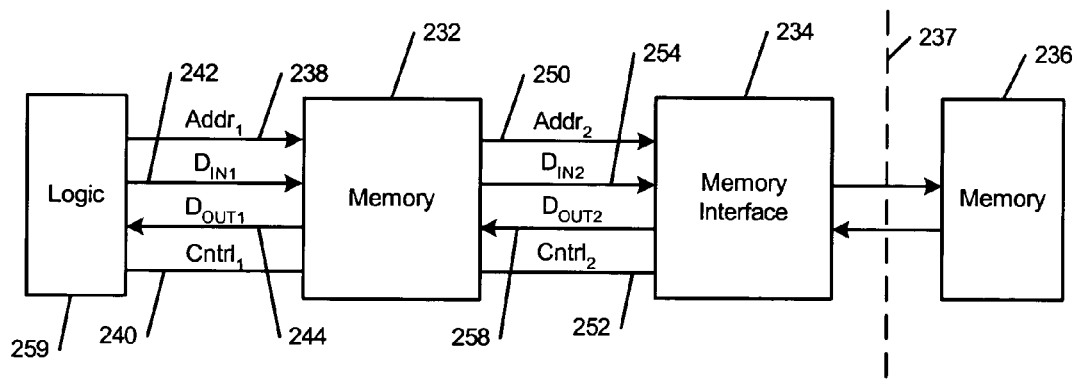
FIG. 10 is a functional block diagram of an external memory circuit according to the present invention.

Referring now to FIG. 10, an external memory circuit 230 according to the present invention is shown. The embedded memory circuit 230 includes a first memory 232, a memory interface 234, and a second memory 236. As can be appreciated, the first memory 232 and the memory interface 234 are not formed on a single wafer or microchip as indicated by dotted lines 237. The first memory 232 includes first address and control inputs 236 and 238, respectively, data input 242, and data output 244. The memory interface 244 includes second address and control inputs 250 and 252, respectively, data input 254, and data output 258. The first memory 232 is connected to logic 259.

The first memory 202 and 232 is preferably Content Addressable Memory (CAM) or associative memory. CAM is a storage device that can be addressed by its own contents. Each bit of CAM storage includes comparison logic. An address input to the CAM is simultaneously compared with all of the stored addresses. The match result is the corresponding data for the matched address. The CAM operates as a data parallel processor. CAMs have a performance advantage over other memory search algorithms. This is due to the simultaneous comparison of the desired information against the entire list of stored entries. While CAM is preferably employed, the first memory 202 and 232 can be standard memory, logic, or any other suitable electronic storage medium.

Figure 11:
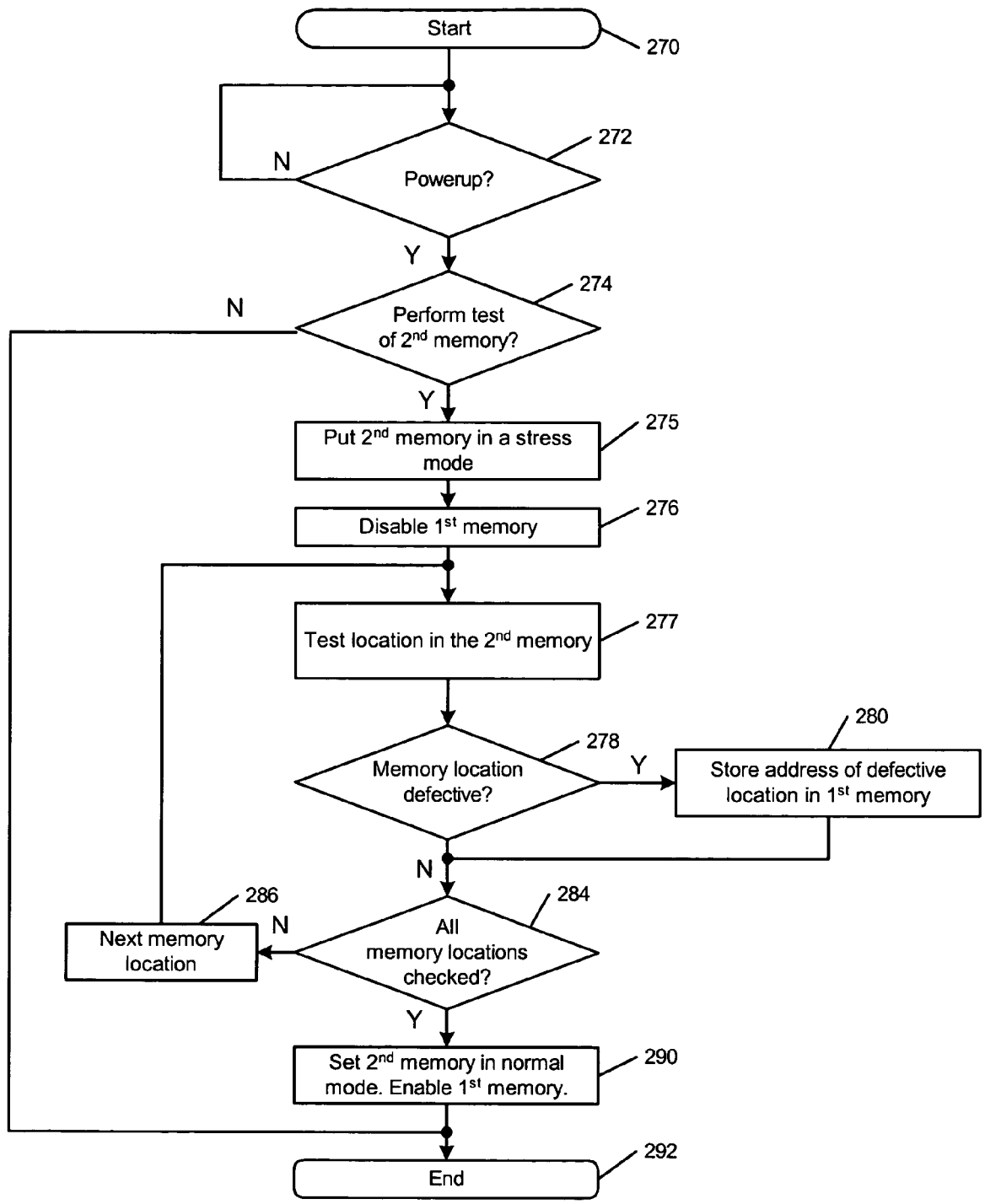
FIG. 11 is a flowchart illustrating steps performed by the memory circuit according to the present invention for identifying defective memory addresses.

Referring now to FIG. 11, steps that are performed by the memory circuits illustrated in FIGS. 9 and 10 during startup are shown. Control begins with step 270. In step 272, control determines whether the memory circuit is powered up. If not, control loops to step 272. Otherwise, control continues with step 274 where control determines whether a test of the second memory is requested.

If step 274 is true, control continues with step 275 where the second memory is placed in a stress mode or condition. In step 276, the first memory is disabled. In step 277, a memory location in the second memory is tested. In step 278, control determines whether the memory location is defective. If it is, control stores the address of the defective address and/or block in the first memory in step 280. Control continues from steps 278 (if false) and step 280 with step 284. In step 284, control determines whether all memory locations in the second memory are checked. If not, control identifies a next memory location in step 286 and returns to step 276. Otherwise, control sets the second memory to normal mode and enables the first memory in step 290. Control ends in step 292.

Figure 12:
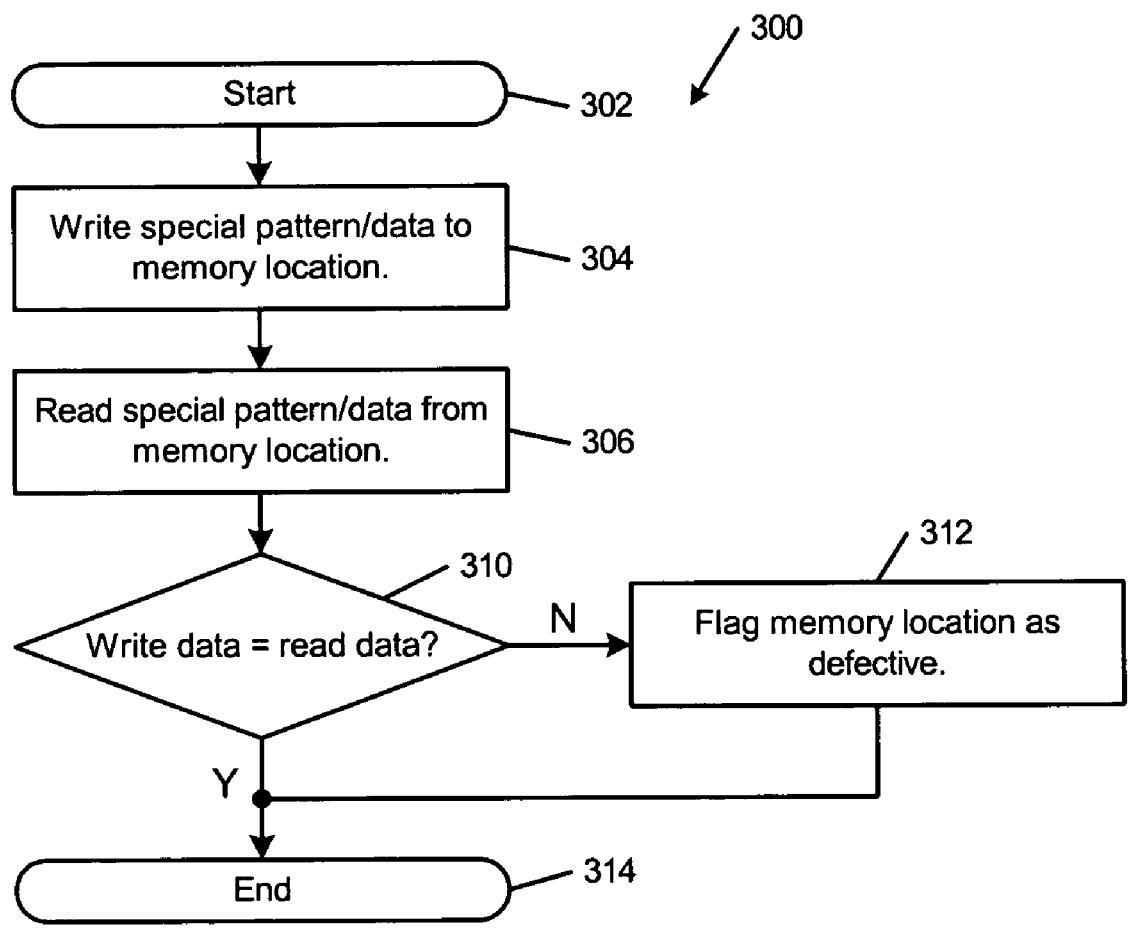
FIG. 12 is a flowchart illustrating steps of one exemplary method for identifying defective memory addresses.

Referring now to FIG. 12, one exemplary method for testing memory locations in the second memory is shown at 300. Control begins with step 302. In step 304, a special pattern/data is written to a memory location. In step 306, the special pattern/data is read from the memory location. In step 310, control determines whether the write data is equal to the read data. If not, control continues with step 312 where the memory location is flagged as defective. The address of the defective location(s) are stored in the first memory. Control continues from step 310 (if true) and step 312 with step 314 where control ends.

As can be appreciated, testing of the memory storing the data in the memory circuits according to the present invention may be performed during manufacture and/or assembly, when the second memory is first started up, every time the second memory is started up, periodically, or randomly during subsequent startups. Testing may be performed by logic such as the logic 229 and/or by an external testing device. As can be appreciated by skilled artisans, still other criteria may be used for scheduling testing. In addition, all or part of the second memory may be tested.

Figure 13A:
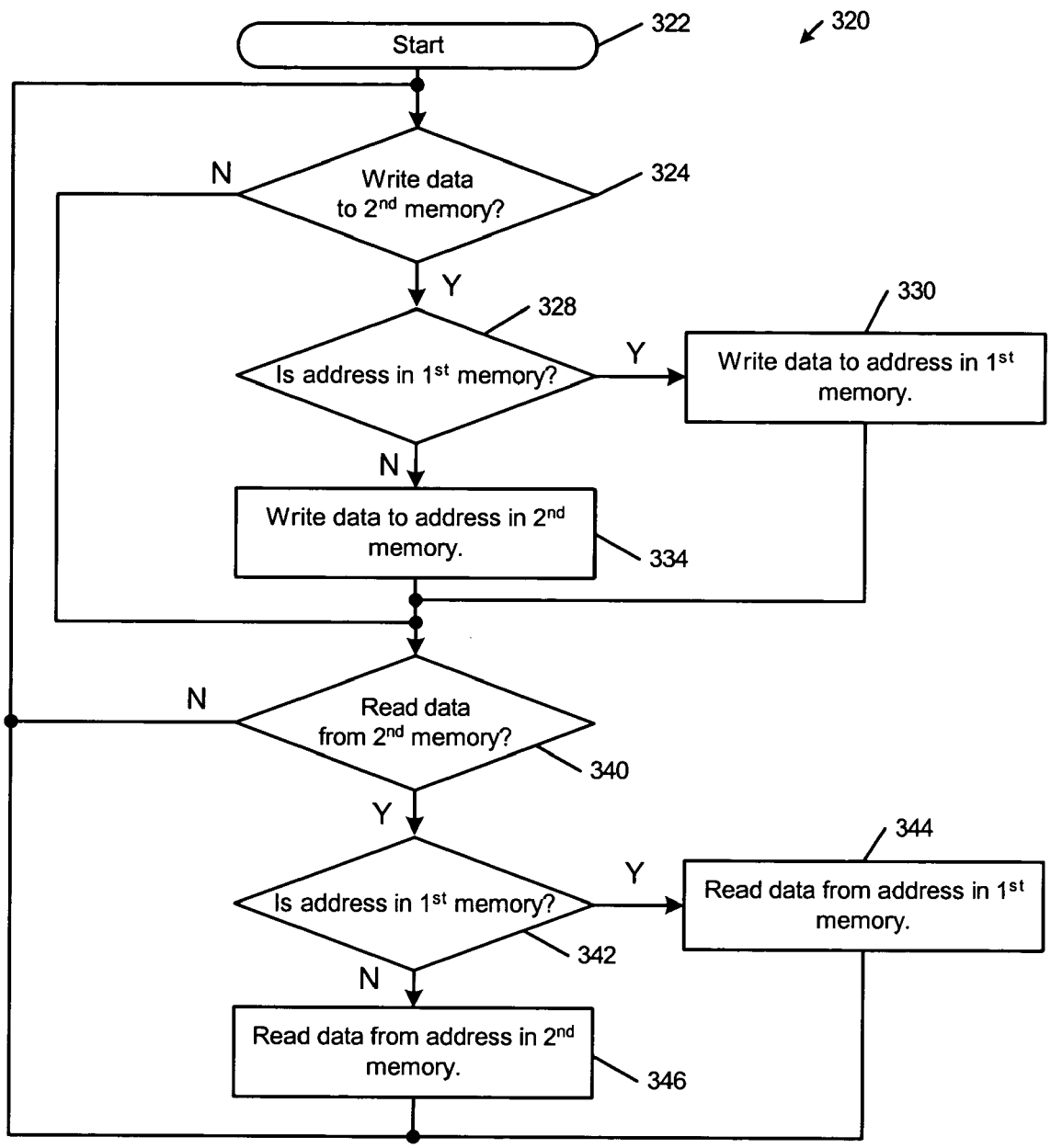
FIGS. 13A and 13B are flowcharts illustrating steps for operating a memory circuit according to the present invention.
Figure 13B:
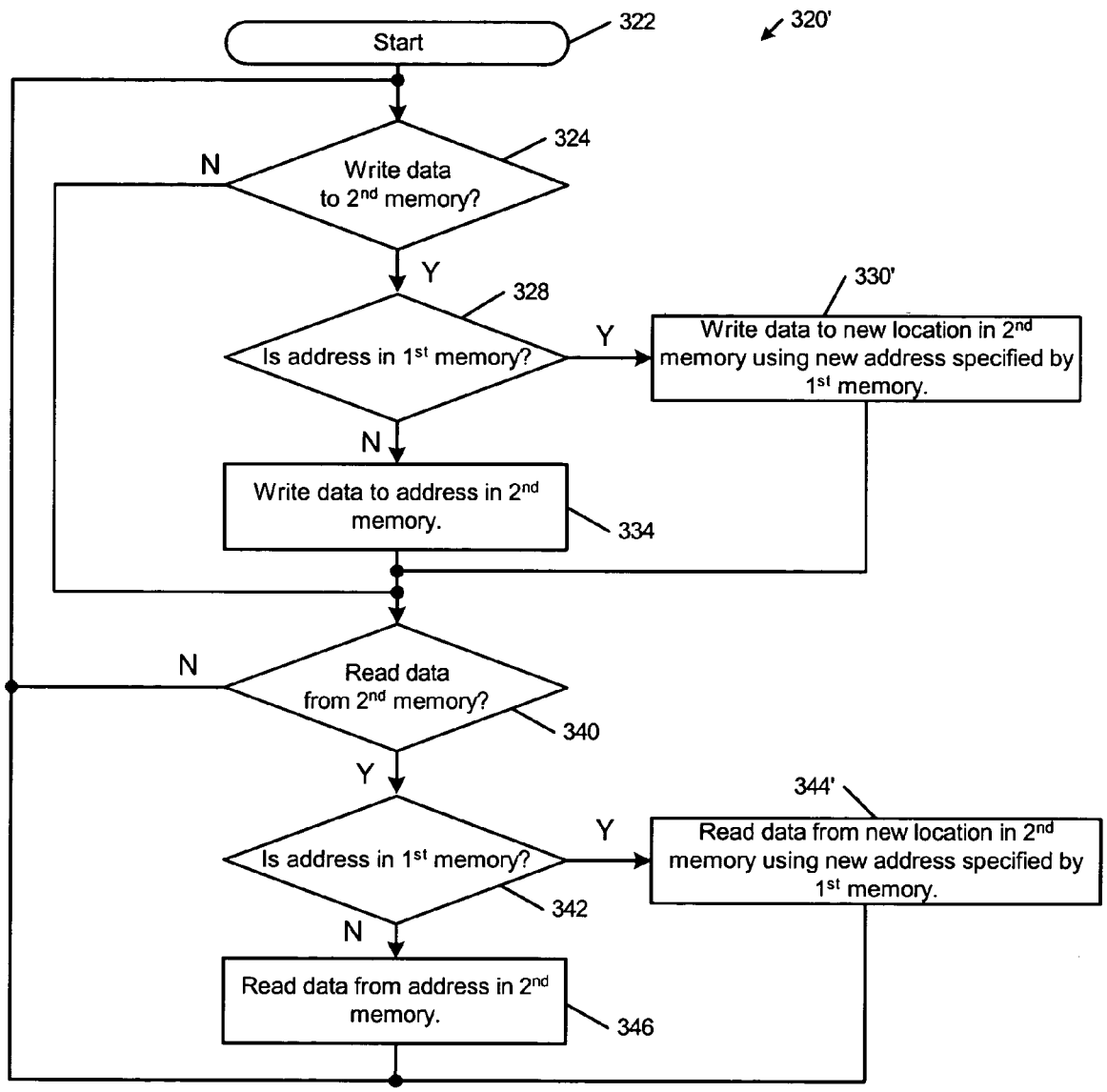

After identifying defective locations in the second memory and storing the corresponding memory addresses in the first memory, the memory circuit operates as depicted generally at 320 in FIGS. 13A and 320' in FIG. 13B. In FIG. 13A, control begins with step 322. In step 324, control determines whether data is being written to the second memory. If it is, control determines whether the write data address is equal to an address in the first memory in step 328. If it is, the data is written to the address stored in the first memory. If the address is not in the first memory, control continues with step 334 where the data is written to the address in the second memory. In another alternate embodiment, data can also be written to the original address in the second memory (even if bad) to simplify the memory circuit. If data is to be read from the second memory as determined in step 340, control determines whether the read data address is equal to an address in the first memory in step 342. If it is, control continues with step 344 and reads data from the address in the first memory. Otherwise control continues with step 346 and reads data from the address in the second memory.

Referring now to FIG. 13B, an alternate method is shown at 320'. If the write address is in the first memory as determined in step 328, data is written to a new and non-defective location in the second memory using a new address specified by the first memory in step 330'. If the read address is in the first memory as determined in step 342, data is read from the new location in the second memory using new address specified by the first memory in step 344'. In FIGS. 13A and 13B, data can be written to the original memory address (even if bad) to simplify the circuit.

Figure 14A:
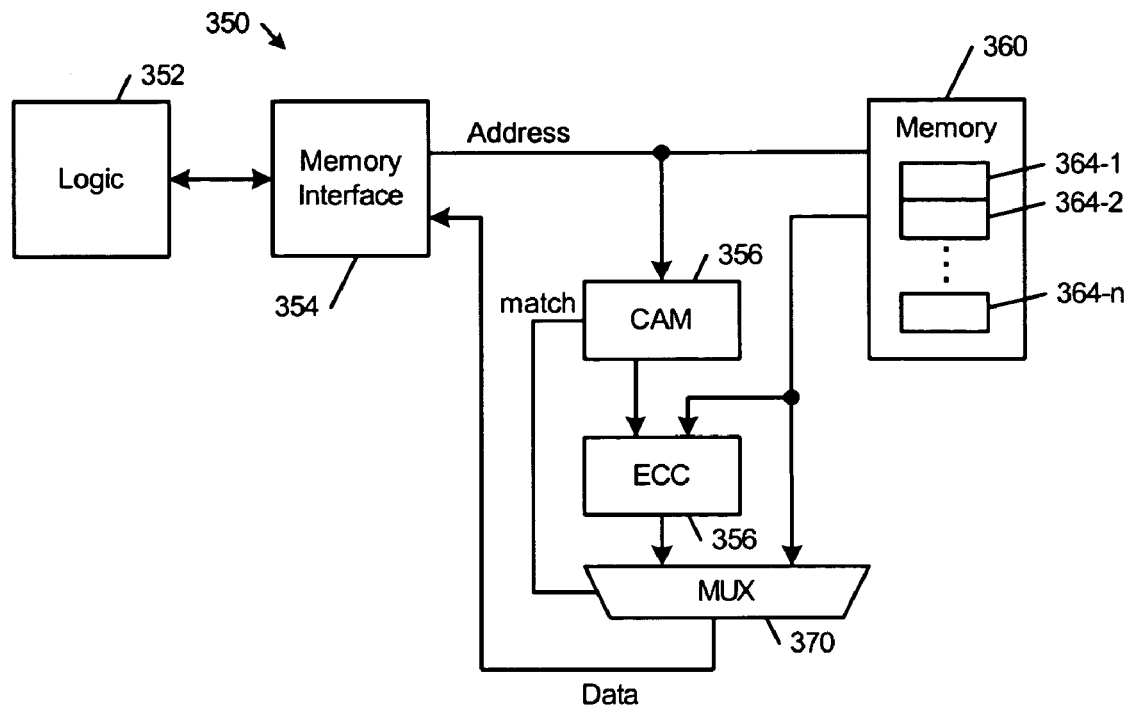
FIGS. 14A and 14B are a functional block diagrams of memory circuits with a CAM, an ECC circuit and a second memory according to the present invention.

Referring now to FIG. 14A, a read operation in a memory circuit 350 according to the present invention is shown. The memory circuit 350 provides error correction coding (ECC) for defective memory locations found in a second memory 360. The memory circuit 350 includes logic 352 that is coupled to a memory interface 354. An address line of the memory interface 354 is coupled to CAM 356 and memory 360. The memory 360 includes memory locations 364-1, 364-2, . . . and 364-n. The CAM includes m memory locations. In a preferred embodiment, n>>m. The CAM 356 is preferably less than 5% of the size of the second memory 360. For example, the CAM 356 is approximately 1% of the size of the second memory 360.

The CAM 356 is coupled to an ECC circuit 366. An output of the ECC circuit is coupled to a multiplexer 370. When an address is output by the memory interface 354 to the second memory 360, the CAM 356 compares the address to stored addresses. If a match is found, the CAM 356 outputs a match signal to the multiplexer 370 and ECC bits to the ECC circuit 366. The ECC circuit 366 and the multiplexer also receive the data from the second memory 360. The ECC circuit 370 uses ECC bits from the CAM 356 and outputs data to the multiplexer 370. The multiplexer 370 selects the output of the ECC circuit 370 when a match occurs. The multiplexer 370 selects the output of the second memory 360 when a match does not occur.

As can be appreciated, the memory is 360 preferably CAM. However, other types of memory such as SDRAM, DRAM, SRAM, and/or any other suitable electronic storage media can be used for the memory 360 instead of the CAM. The first memory 360 may be fabricated on a first microchip with at least one of the logic circuit 352, the memory interface 354, and the ECC circuit 366. The second memory 360 can be fabricated on a second microchip or on the first microchip.

Figure 14B:
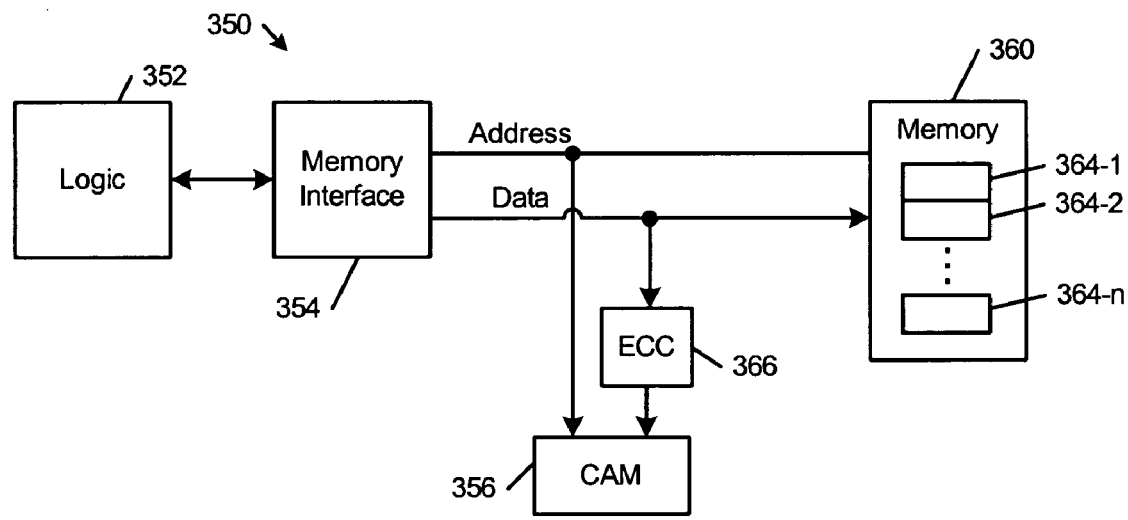

Referring now to FIG. 14B, the memory circuit 350 for a write operation is shown. The memory interface 354 outputs a write address to the second memory 360. If the address matches an address stored in the CAM 356, the CAM 356 stores the ECC bits generated by the ECC circuit 366 in a location associated with the matched address.

Figure 15:
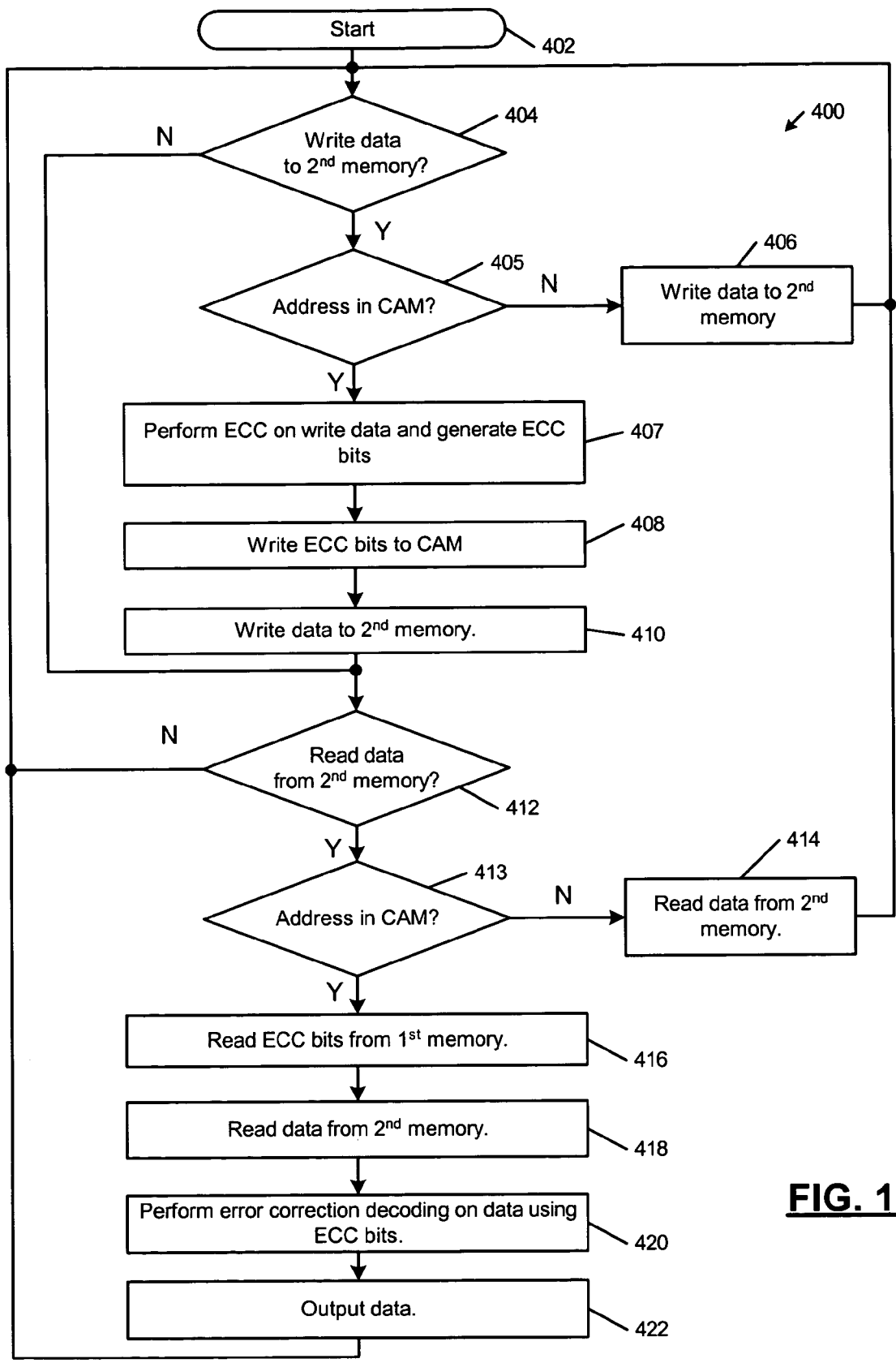
FIG. 15 is a flowchart illustrating the operation of the memory circuits of FIG. 14.

Referring now to FIG. 15, steps for operating the memory circuits 350 of FIGS. 14A and 14B are shown generally at 400. Control begins with step 402. In step 404, control determines whether data is to be written from the logic 352 to the second memory 360. If step 404 is true, control continues with step 405 where control determines whether the address is defective. In not, control continues with step 406 and reads the data from the address in the memory. If step 405 is true, control continues with step 407 where the ECC 366 generates ECC bits. In step 408, the ECC bits are written to the CAM 356. In step 410, the data is written to the second memory 360.

If the result of step 404 is false, control continues with step 412. In step 412, control determines whether data is to be read from the second memory 360. If true, control continues with step 413 where control determines whether the address is defective. If not, control continues with step 414 and reads the data from the memory. Otherwise, control continues with step 416 where ECC bits are read from the CAM 356. In step 418, data is read from the second memory 360. The ECC 356 performs error correction coding on the data using the ECC bits in step 420. In step 422, the data is output to the logic 352. If step 412 is false, control returns to step 404.

Figure 16A:
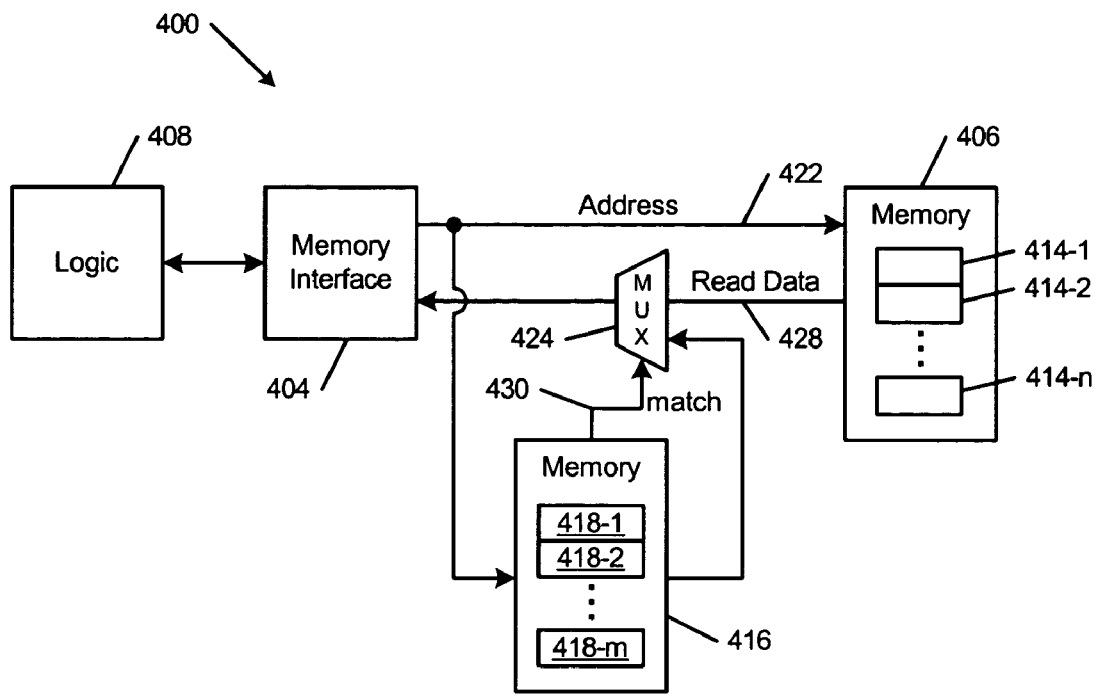
FIGS. 16A and 16B are functional block diagrams of a memory circuit including a first memory and a second memory according to the present invention.

For referring now to FIG. 16A, a memory circuit 400 is illustrated. A memory interface 404 is coupled to a first memory 406 that includes a plurality of memory locations 414-1, 414-2, . . . , and 414-n. The memory interface 404 is typically connected to logic 408. A second memory 416 includes a plurality of memory locations 418-1, 418-2, . . . , and 418-m. The second memory 416 is coupled to an address line 422. The second memory 416 is also coupled to a multiplexer 424. The multiplexer 424 is connected to a read data line 428 from the first memory 406. A control line 430 or match line connects the second memory 416 to the multiplexer 424. As with the memory circuit in FIG. 14, n>>m.

In use, the second memory 416 monitors addresses transmitted on the address line 422 to the first memory 406. If the second memory 416 has a matching address, the second memory 416 generates a control signal via the control line 430 and outputs the corresponding data to the multiplexer 424. The data is routed by the multiplexer 424 to the memory interface 404.

Figure 16B:
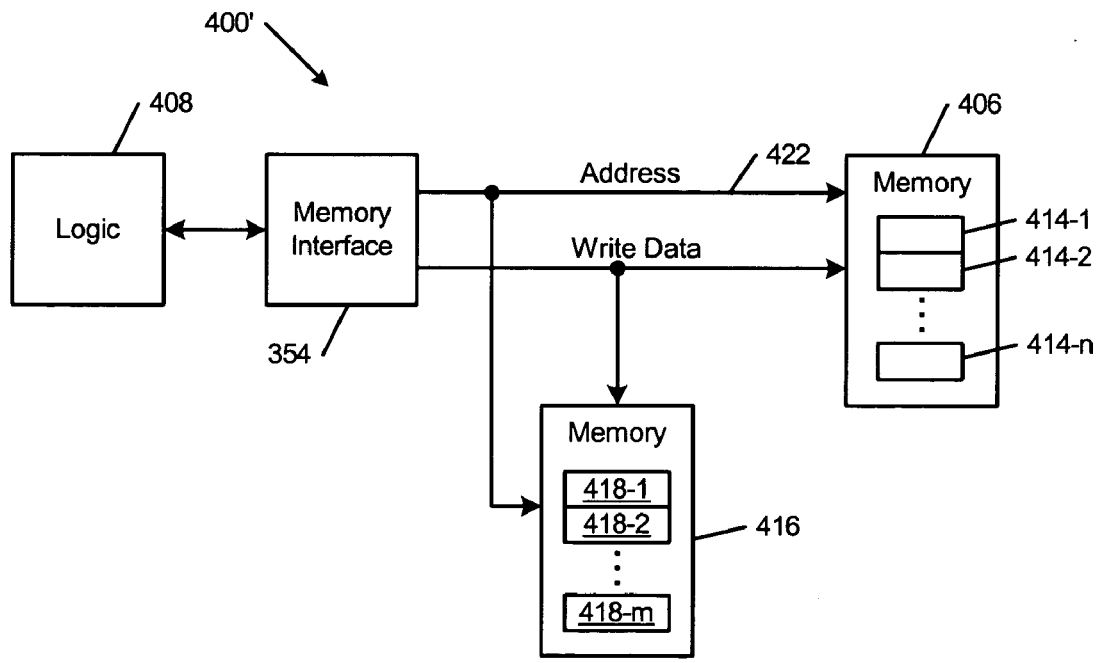

Referring now to FIG. 16B, the memory circuit 400' is illustrated during a write data operation. The second memory 416 monitors the address line 422. If the address matches an address stored in the second memory 416, the second memory 416 writes the data to a location corresponding to the matched address in the second memory 416. To simplify the memory circuit 400', the data can be optionally written to the first memory as well. The first memory 406 can be ECC memory with ECC bits.

As can be appreciated, the present invention contemplates using CAM for the memory 202, 232, 358, and 416 to provide optimum memory access times. However, any other suitable electronic storage medium may be used such as DRAM, SRAM, SDRAM, etc. The ECC and control circuit 356 may be combinatorial ECC.

As can be appreciated, the memory that stores the data can be tested for defects at the time of manufacture, at the time of assembly, during operation, at power up or at any other suitable time.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A memory circuit comprising:
   a memory interface;
   a first memory that receives a first write address that is associated with first data from said memory interface;
   a second memory that stores addresses of defective memory locations found in said first memory, that receives said first write address from said memory interface, that compares said first write address to said addresses stored in said second memory, and, if a matching address is found, writes said first data to said second memory.

2. The memory circuit of claim 1 wherein said second memory writes said first data to a memory location in said second memory that is associated with said matching memory address.

3. The memory circuit of claim 1 wherein said first memory writes said first write data to a memory location in said first memory corresponding to said first write address.

4. The memory circuit of claim 1 wherein said memory circuit is implemented in a hard drive controller.

5. The memory circuit of claim 1 wherein said second memory is content addressable memory (CAM).

6. The memory circuit of claim 1 wherein said first memory is error correction coding (ECC) memory that stores ECC bits.

7. A memory circuit comprising:
   a memory interface;
   first memory means for receiving a first write address that is associated with first data from said memory interface;
   second memory means for storing addresses of defective memory locations found in said first memory means, for receiving said first write address from said memory interface, for comparing said first write address to said addresses stored in said second memory means, and, if a matching address is found, for writing said first data to said second memory means.

8. The memory circuit of claim 7 wherein said second memory means writes said first data to a memory location in said second memory means that is associated with said matching memory address.

9. The memory circuit of claim 7 wherein said first memory means writes said first write data to a memory location in said first memory means corresponding to said first write address.

10. The memory circuit of claim 7 wherein said memory circuit is implemented in a hard drive controller.

11. The memory circuit of claim 7 wherein said second memory includes content addressable memory (CAM).

12. The memory circuit of claim 7 wherein said first memory means is error correction coding (ECC) memory that stores ECC bits.

* * * * *

UNITED STATES PATENT AND TRADEMARK OFFICE
CERTIFICATE OF CORRECTION

| | |
|---|---|
| PATENT NO. | : 7,073,099 B1 |
| APPLICATION NO. | : 10/184334 |
| DATED | : July 4, 2005 |
| INVENTOR(S) | : Sehat Sutardja et al. |

It is certified that error appears in the above-identified patent and that said Letters Patent is hereby corrected as shown below:

Column 8, Line 44:          Delete "In" and insert --If--

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,073,099 B1 | Page 1 of 1 |
| APPLICATION NO. | : 10/184334 | |
| DATED | : July 4, 2006 | |
| INVENTOR(S) | : Sehat Sutardja et al. | |

It is certified that error appears in the above-identified patent and that said Letters Patent is hereby corrected as shown below:

Column 8, Line 44:     Delete "In" and insert --If--

This certificate supersedes Certificate of Correction issued December 19, 2006.

Signed and Sealed this

Thirtieth Day of January, 2007

JON W. DUDAS
*Director of the United States Patent and Trademark Office*